United States Patent
Sin et al.

(10) Patent No.: US 9,416,439 B2
(45) Date of Patent: Aug. 16, 2016

(54) SPUTTERING TARGET, METHOD OF FABRICATING THE SAME, AND METHOD OF FABRICATING AN ORGANIC LIGHT EMITTING DISPLAY APPARATUS

(71) Applicant: Samsung Display Co., Ltd., Yongin, Gyeonggi-Do (KR)

(72) Inventors: Sang-Wook Sin, Yongin (KR); Sun-Young Jung, Yongin (KR); Il-Sang Lee, Yongin (KR); Jin-Woo Park, Yongin (KR); Dong-Jin Kim, Yongin (KR)

(73) Assignee: Samsung Display Co., Ltd. (KR)

(*) Notice: Subject to any disclaimer, the term of this patent is extended or adjusted under 35 U.S.C. 154(b) by 46 days.

(21) Appl. No.: 14/223,605

(22) Filed: Mar. 24, 2014

(65) Prior Publication Data
US 2015/0031153 A1 Jan. 29, 2015

(30) Foreign Application Priority Data
Jul. 29, 2013 (KR) .................. 10-2013-0089822

(51) Int. Cl.
| H01L 21/00 | (2006.01) |
| C23C 14/34 | (2006.01) |
| B29C 43/00 | (2006.01) |
| C23C 14/08 | (2006.01) |
| C23C 24/10 | (2006.01) |
| H01L 51/52 | (2006.01) |
| B29K 105/00 | (2006.01) |

(52) U.S. Cl.
CPC ........... *C23C 14/3414* (2013.01); *B29C 43/006* (2013.01); *C23C 14/08* (2013.01); *C23C 24/10* (2013.01); *H01L 51/5237* (2013.01); *B29K 2105/251* (2013.01)

(58) Field of Classification Search
None
See application file for complete search history.

(56) References Cited

U.S. PATENT DOCUMENTS

| 5,342,452 A * | 8/1994 | Saito ............... H01L 31/022466 136/256 |
| 7,615,506 B2 | 11/2009 | Aitken et al. |
| 2007/0189916 A1 | 8/2007 | Zhang |
| 2008/0075844 A1 | 3/2008 | Ha et al. |
| 2008/0274351 A1* | 11/2008 | Itoh ......................... B28B 3/003 428/337 |
| 2009/0305066 A1* | 12/2009 | Hommura ............. C23C 14/086 428/480 |
| 2010/0320481 A1* | 12/2010 | Kashiwabara ...... H01L 27/3244 257/88 |
| 2013/0243967 A1* | 9/2013 | Lee ..................... C23C 14/0057 427/534 |
| 2014/0141354 A1* | 5/2014 | Park .................... H01M 4/8663 429/482 |
| 2014/0145155 A1* | 5/2014 | Park .................... H01L 27/3244 257/40 |
| 2015/0148476 A1* | 5/2015 | Thetford ................ C08G 69/48 524/570 |

FOREIGN PATENT DOCUMENTS

| JP | 07187769 A | * | 7/1995 | |
| JP | 2007008752 A | * | 1/2007 | |
| KR | 1020070001812 | | 1/2007 | |
| KR | 20150007865 A | * | 1/2015 | ............. H01L 51/50 |

* cited by examiner

*Primary Examiner* — David E Graybill
(74) *Attorney, Agent, or Firm* — Innovation Counsel LLP (57) ABSTRACT

A method of fabricating a sputtering target is provided. The method includes preparing a first powder material, wherein the first powder material includes tin oxide; preparing a mixture by mixing the first powder material and a second powder material, wherein the second powder material includes carbon; and fabricating the sputtering target by compressing and sintering the mixture simultaneously in a reducing atmosphere.

12 Claims, 11 Drawing Sheets

SPUTTERING TARGET, METHOD OF FABRICATING THE SAME, AND METHOD OF FABRICATING AN ORGANIC LIGHT EMITTING DISPLAY APPARATUS

RELATED APPLICATIONS

This application claims the benefit of Korean Patent Application No. 10-2013-0089822 filed on Jul. 29, 2013, the entire contents of which are incorporated herein by reference.

BACKGROUND

1. Technical Field

The present disclosure generally relates to an organic light-emitting display apparatus including a thin film encapsulation layer. More particularly, the present disclosure relates to a sputtering target that is used to form the thin film encapsulation layer, and a method of fabricating the sputtering target.

2. Description of the Related Art

An organic light-emitting display apparatus has superior characteristics such as wide viewing angles, high contrast, rapid response times, good luminance, and can be driven using a low driving voltage. In addition, the organic light-emitting display apparatus may provide a polychromatic display.

The organic light-emitting apparatus may include an organic light-emitting device. However, the organic light-emitting device may be negatively impacted by moisture and oxygen. Thus, the organic light-emitting display apparatus may include an encapsulation structure for encapsulating the organic light-emitting device, so as to protect the organic light-emitting device from moisture and oxygen.

The encapsulation structure may include a thin film encapsulation layer. The thin film encapsulation layer may include an inorganic material. The thin film encapsulation layer may be formed using a sputtering process, wherein a sputtering target constitutes a cathode, and a substrate (on which the thin film encapsulation layer is formed) constitutes an anode. As a result, the target maintains a negative potential relative to the substrate.

During the sputtering process, cationically ionized material may be accelerated toward the target due to the negative potential. When the cationically ionized material collides with the target, atoms of the target are emitted from the target. When the thin film encapsulation layer includes an insulating inorganic material, the target also includes the same insulating inorganic material as the thin film encapsulation layer. However, the insulating inorganic material may result in the target having a high resistance, which lowers the conductivity of the target and makes it more difficult to maintain the target at a negative potential relative to the substrate. As a result of the loss in negative potential, it may be more difficult to form a high quality film through the sputtering process.

SUMMARY

The present disclosure is directed to address at least the above issues when using a conventional sputtering target to form a thin film encapsulation layer.

According to some embodiments of the inventive concept, a method of fabricating a sputtering target is provided. The method includes preparing a first powder material, wherein the first powder material includes tin oxide; preparing a mixture by mixing the first powder material and a second powder material, wherein the second powder material includes carbon; and fabricating the sputtering target by compressing and sintering the mixture simultaneously in a reducing atmosphere.

In some embodiments, preparing the first powder material may include preparing a raw material mixture by mixing a first raw material and a second raw material in a moisture-free environment, wherein the first raw material includes tin oxide, and the second raw material includes at least one of phosphor oxide, boron phosphate, tin fluoride, niobium oxide, silicon oxide, lead fluoride, tungsten oxide, zinc oxide, and boron oxide; melting the raw material mixture in a vacuum; and solidifying and grinding the melted raw material mixture.

In some embodiments, the second powder material may include at least one of carbon black powder and carbon nanotubes.

In some embodiments, the second powder material may include carbon black powder, and wherein the mixture may include about 1 wt % to about 20 wt % of the carbon black powder and about 80 wt % to about 99 wt % of the first powder material.

In some embodiments, the second powder material may include carbon nanotubes, and wherein the mixture may include about 0.1 wt % to about 10 wt % of the carbon nanotubes and about 90 wt % to about 99.9 wt % of the first powder material.

In some embodiments, the reducing atmosphere may be obtained by compressing and sintering the mixture in a carbon-containing container.

In some embodiments, sintering the mixture may include heating the mixture via high frequency induction heating.

In some embodiments, compressing the mixture may include pressurizing the mixture in a container using one or more plates.

According to some other embodiments of the inventive concept, a sputtering target is provided. The sputtering target includes a mixture of a first powder material and a second powder material, wherein the first powder material includes tin oxide and the second powder material includes carbon.

In some embodiments, the first powder material may further include at least one of phosphor oxide, boron phosphate, tin fluoride, niobium oxide, silicon oxide, lead fluoride, tungsten oxide, zinc oxide, and boron oxide.

In some embodiments, the second powder material may include at least one of carbon black powder and carbon nanotubes.

In some embodiments, the second powder material may include carbon black powder, and wherein the mixture may include about 1 wt % to about 20 wt % of the carbon black powder and about 80 wt % to about 99 wt % of the first powder material.

In some embodiments, the second powder material may include carbon nanotubes, and wherein the mixture may include about 0.1 wt % to about 10 wt % of the carbon nanotubes and about 90 wt % to about 99.9 wt % of the first powder material.

In some embodiments, an electrical resistance of the sputtering target may be smaller than an electrical resistance of the first powder material.

According to some further embodiments of the inventive concept, a method of manufacturing an organic light-emitting display apparatus is provided. The method includes forming an organic light-emitting unit on a substrate, wherein the organic light-emitting unit includes a lower electrode, an organic light-emitting layer, and an upper electrode; and forming a thin film encapsulation layer for encapsulating the organic light-emitting unit, wherein the thin film encapsulation layer is formed using a sputtering target and a sputtering method, wherein the sputtering target comprises a first powder material including tin oxide and a second powder material including carbon, and wherein the thin film encapsulation layer includes the first powder material, and the carbon is omitted from the thin film encapsulation layer.

In some embodiments, the sputtering target may further include at least one of phosphor oxide, boron phosphate, tin fluoride, niobium oxide, silicon oxide, lead fluoride, tungsten oxide, zinc oxide, and boron oxide, and the thin film encapsulation layer may further include at least one of the phosphor oxide, boron phosphate, tin fluoride, niobium oxide, silicon oxide, lead fluoride, tungsten oxide, zinc oxide, and boron oxide that is included in the sputtering target.

In some embodiments, the second powder material may include at least one of carbon black powder and carbon nanotubes.

In some embodiments, the second powder material may include carbon black powder, and wherein the sputtering target may include about 1 wt % to about 20 wt % of the carbon black powder and about 80 wt % to about 99 wt % of the first powder material.

In some embodiments, the second powder material may include carbon nanotubes, and wherein the sputtering target may include about 0.1 wt % to about 10 wt % of the carbon nanotubes and about 90 wt % to about 99.9 wt % of the first powder material.

DETAILED DESCRIPTION

The inventive concept will be described more fully with reference to the accompanying drawings, in which different embodiments are shown. Like reference numerals in the drawings denote like elements, and thus a repeated description of those similar elements will be omitted. In the drawings, the lengths and sizes of elements may be exaggerated for clarity and convenience of description. Expressions such as "at least one of," when preceding a list of elements, modify the entire list of elements and should not be construed as modifying the individual elements of the list.

It is understood that although the terms 'first', 'second', etc. may be used herein to describe various elements, the elements should not be limited by these terms. These terms are only used to distinguish one element from another. It is further understood that when a layer, a region, or an element is referred to as being disposed "on" another layer, region, or element, it can be disposed directly on the other layer, region, or element, or with one or more intervening layers, regions, or elements being present.

Figure 1:
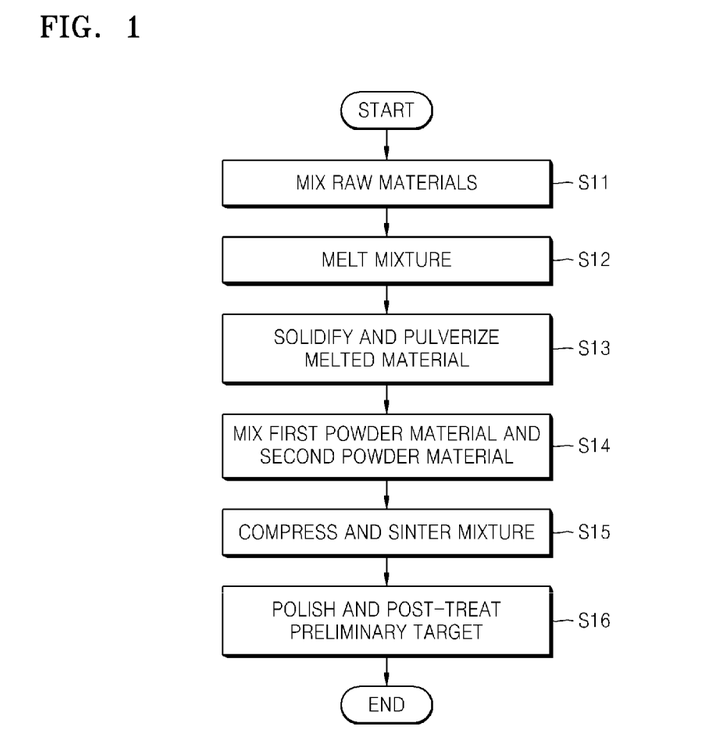
FIG. 1 is a flowchart of a method of fabricating a sputtering target in accordance with an exemplary embodiment of the inventive concept.

FIG. 1 is a flowchart of a method of fabricating a sputtering target in accordance with an exemplary embodiment of the inventive concept.

First, a first powder material is provided. The first powder material refers to a material in a powder state. The first powder material may include a low viscosity transition (LVT) inorganic material having a low viscosity transition temperature. The viscosity transition temperature does not refer to the temperature at which the LVT inorganic material completely changes from a solid to a liquid. Instead, the viscosity transition temperature refers to the minimum temperature at which molecules in the LVT inorganic material begin to move (i.e., the temperature at which the LVT inorganic material starts to become fluid).

The organic light-emitting display apparatus may include an organic light emitting unit having a transformation temperature. The transformation temperature of the organic light-emitting unit refers to a temperature at which a material in the organic light-emitting unit is chemically or physically transformed. For example, the aforementioned transformation temperature may refer to a glass transition temperature (Tg) of an organic material in the organic light-emitting unit. The Tg may be obtained by performing, for example, thermal analysis using thermo gravimetric analysis (TGA) or differential scanning calorimetry (DSC) on the organic material. In the embodiments of this inventive concept, the Tg of the organic material may be about 110 degrees Celsius or higher.

In some embodiments, the viscosity transition temperature of the first powder material may be lower than the transformation temperature of the organic light-emitting unit. However, in some embodiments, it may be desirable to form a film using a first powder material having a viscosity transition temperature that is higher than a transformation temperature of the organic light-emitting unit. Accordingly, in those other embodiments, the viscosity transition temperature of the first powder material may be higher than the transformation temperature of the organic light-emitting unit.

The LVT inorganic material may include tin oxide. The LVT inorganic material may be obtained using a single compound, or a mixture of two or more compounds. As previously mentioned, the first powder material includes the LVT inorganic material.

In some embodiments, the first powder material may include at least tin oxide (e.g., SnO or $SnO_2$). In addition to the tin oxide, the first powder material may include at least one of phosphor oxide (e.g., $P_2O_5$), boron phosphate ($BPO_4$), tin fluoride (e.g., $SnF_2$), niobium oxide (e.g., NbO and $Nb_2O_5$), lead fluoride (e.g., $PbF_2$), silicon oxide (e.g., $SiO_2$), tungsten oxide (e.g., $WO_3$), zinc oxide (e.g., ZnO), and boron oxide (e.g., $B_2O_3$).

For example, the first powder material may include one or more of the following materials or sets of materials: SnO; [SnO and $P_2O_5$]; [SnO and $BPO_4$]; [SnO, $SnF_2$, and $P_2O_5$]; [SnO, $SnF_2$, $P_2O_5$, and NbO]; [SnO, $SnF_2$, $P_2O_5$, and $WO_3$]; [SnO, $P_2O_5$, and $B_2O_3$]; [SnO, $P_2O_5$, $B_2O_3$, and ZnO]; or [SnO, $B_2O_3$, ZnO, and $SiO_2$].

Nevertheless, the first powder material is not limited to the materials or sets of materials described above. For example, the first powder material may also include one or more of the following compounds:

1) SnO (about 100 mol %);
2) SnO (about 80 mol %) and $P_2O_5$ (about 20 mol %);
3) SnO (about 90 mol %) and $BPO_4$ (about 10 mol %);
4) SnO (about 20-50 mol %), $SnF_2$ (about 30-60 mol %) and $P_2O_5$ (about 10-30 mol %) (Here, the sum of SnO, $SnF_2$, and $P_2O_5$ is about 100 mol %);
5) SnO (about 20-50 mol %), $SnF_2$ (about 30-60 mol %), $P_2O_5$ (about 10-30 mol %), and NbO (about 1-5 mol %) (Here, the sum of SnO, $SnF_2$, $P_2O_5$, and NbO is about 100 mol %);
6) SnO (about 20-50 mol %), $SnF_2$ (about 30-60 mol %), $P_2O_5$ (about 10-30 mol %), and $WO_3$ (about 1-5 mol %) (Here, the sum of SnO, $SnF_2$, $P_2O_5$, and $WO_3$ is about 100 mol %);
7) SnO (about 20-70 mol %), $P_2O_5$ (about 5-50 mol %), and $B_2O_3$ (about 5-50 mol %) (Here, the sum of SnO, $P_2O_5$, and $B_2O_3$ is about 100 mol %);
8) SnO (about 20-70 mol %), $P_2O_5$ (about 5-50 mol %), $B_2O_3$ (about 5-50 mol %), and ZnO (about 5-20 mol %) (Here, the sum of SnO, $P_2O_5$, $B_2O_3$, and ZnO is about 100 mol %); or
9) SnO (about 20-70 mol %), $B_2O_3$ (about 5-50 mol %), ZnO (about 5-20 mol %), and $SiO_2$ (about 5-20 mol %) (Here, the sum of SnO, $B_2O_3$, ZnO, and $SiO_2$ is about 100 mol %).

In some embodiments, the first powder material may include SnO (about 42.5 mol %), SnF (about 40 mol %), $P_2O_5$ (about 15 mol %), and $WO_3$ (about 2.5 mol %).

The first powder material may be prepared using the Steps S11, S12, and S13 depicted in FIG. 1, as described below.

First, raw materials are mixed (Step S11). Specifically, a raw material mixture is obtained by mixing a first raw material and a second raw material. The first raw material may include tin oxide. The second raw material may include at least one of phosphor oxide (e.g., $P_2O_5$), boron phosphate ($BPO_4$), tin fluoride (e.g., $SnF_2$), niobium oxide (e.g., NbO and $Nb_2O_5$), lead fluoride (e.g., $PbF_2$), silicon oxide (e.g., $SiO_2$), tungsten oxide (e.g., $WO_3$), zinc oxide (e.g., ZnO), and boron oxide (e.g., $B_2O_3$).

The first raw material and the second raw material may be provided in a powder state. The first raw material and the second raw material are mixed in an environment that is free from moisture, for the reasons discussed below.

The second raw material (e.g., tin fluoride and phosphor oxide) may be highly reactive in moisture. As a result, when the first raw material and the second raw material are mixed in an atmospheric environment, the second raw material may absorb the moisture, thereby altering the chemical and physical properties of the second raw material. Accordingly, the composition of the raw material mixture will be modified. Since the sputtering target is fabricated from the raw material mixture (as described later in the specification), the sputtering target may be contaminated by the modified raw material mixture. As a result, defects may be introduced into the thin film and the sputtering equipment may be contaminated during the sputtering process. Thus, the mixing of the first raw material and the second material may be carried out in a glove box that is free from (and blocks out) moisture.

After the raw materials have been mixed, the raw material mixture is melted (Step S12).

Since the raw material mixture includes an LVT inorganic material, the melting may be performed at a relatively low temperature. However, it may be necessary to melt the raw material mixture in a vacuum environment. This is because if the raw material mixture is melted in an ambient environment containing moisture and oxygen, impurities may be incorporated into the melted mixture, thereby affecting the purity of the melted mixture. It should be noted that the degree of vacuum may be varied accordingly by one of ordinary skill in the art, depending on the type of raw material mixture that is being melted.

Next, the melted material mixture is solidified and ground (pulverized) to form a first powder material (Step S13).

The melted material is solidified by rapidly cooling the melted material mixture to room temperature. The rapid cooling may be performed using a method similar to that for forming glass. The solidified material then undergoes a coarse grinding followed by a fine grinding to yield the first powder material.

Figure 3:
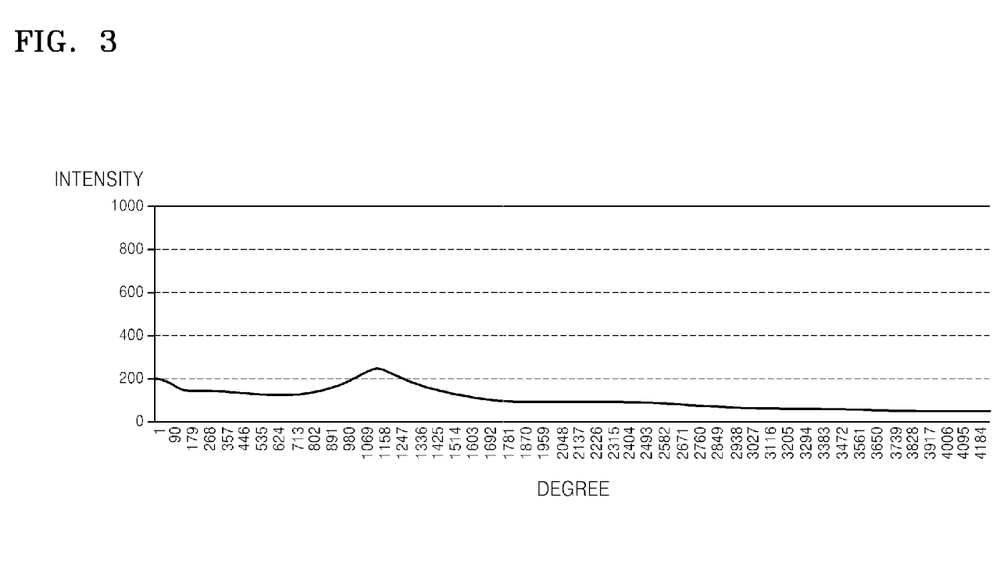
FIG. 3 is a graph illustrating an X-ray diffraction (XRD) result of a first powder material in accordance with an exemplary embodiment.

The state of the first powder material (e.g., whether the material is amorphous or crystalline) can be determined using X-ray diffraction (XRD). FIG. 3 is a graph illustrating an XRD result of a first powder material in accordance with an exemplary embodiment. Referring to FIG. 3, the first powder material (that is being analyzed) includes a Sn—P—O-based material (e.g., SnO (about 80 mol %) and $P_2O_5$ (about 20 mol %)). Since the XRD result in FIG. 3 does not indicate any sharp peak intensities, the first powder material is therefore in an amorphous state.

Referring back to FIG. 1, the first powder material is then mixed with a second powder material to prepare a mixture (Step S14).

As previously described, the first powder material may include various oxides (e.g., tin oxide), fluorides, or other halides. The metal cations and oxygen anions in the aforementioned inorganic materials form strong covalent bonds. As a result, the first powder material may include an insulating material having a high resistance. However, if the sputtering target is fabricated using only the first powder material, the sputtering target may have a high resistance. As mentioned previously, the low conductivity of the sputtering target makes it difficult for the target to maintain a negative potential relative to the substrate, and the loss in negative potential may affect the sputtering process and inhibit film formation.

To lower the resistance of the sputtering target, a second powder material is mixed with the first powder material, and the sputtering target is then fabricated from the mixture of the first and second powder materials.

The second powder material may include carbon and/or carbon-containing materials. The carbon-containing materials may possess a high melting point, and are capable of forming a stable covalent bond with oxygen, nitrogen, or hydrogen. The carbon-containing materials also impart conductivity to the mixture (comprising the first and second powder materials). For example, the carbon-containing materials may include at least one of carbon nanotubes, conductive carbon black powder, conductive carbon fiber, graphite, and graphene.

Carbon nanotubes are formed in a tube-like shape having a hexagonal honeycomb pattern, in which a carbon atom makes covalent bonds with three other adjacent carbon atoms. Carbon nanotubes generally have a diameter of several nanometers and have good electrical conductivity.

Conductive carbon black powder includes carbon black particles and has good electrical conductivity. When the carbon black particles form a chain structure, pi electrons may move through the chain structure, thus enabling electrical conductivity.

Graphite may be formed as a hexagonal plate shape planar crystal, a scale shape crystal, or a lump shape crystal. Graphite can function as an electrical conductor.

Graphene is a material having a two-dimensional structure of combined carbon atoms through an $sp^2$ bond and having a thickness of one carbon atom. Graphene has good electrical conductivity.

It should be noted that the inventive concept is not limited to the above-described carbon-containing materials, and that the second powder material may also include other types of conductive materials.

In some embodiments, when carbon nanotubes are used in the second powder material, the resulting mixture may have the following composition: carbon nanotubes (ranging from about 0.1 to about 10 wt %) and the first powder material (ranging from about 90 to about 99.9 wt %).

It should be noted that when the concentration of carbon nanotubes in the mixture is less than about 0.1 wt %, the resulting sputtering target may have insufficient electrical conductivity to mitigate the loss in negative potential. Conversely, if the concentration of carbon nanotubes in the mixture exceeds about 10 wt %, it may be difficult to achieve homogeneous mixing of the first and second powder materials.

In some other embodiments, when conductive carbon black powder is used in the second powder material, the resulting mixture may have the following composition: carbon black powder (ranging from about 1 to about 20 wt %) and the first powder material (ranging from about 80 to about 99 wt %).

It should be noted that when the concentration of carbon black powder is less than about 1 wt %, the resulting sputtering target may have insufficient electrical conductivity to mitigate the loss in negative potential. Conversely, if the concentration of carbon black powder in the mixture exceeds about 20 wt %, it may be difficult to achieve homogeneous dispersion of the carbon black powder in the mixture.

When a sputtering target is fabricated using a mixture (in which the second powder material is not homogeneously dispersed), the sputtering target may have a non-uniform surface resistance. As a result, a non-uniform electric field may be formed during the sputtering process, which may generate electric arcs.

Figure 4:
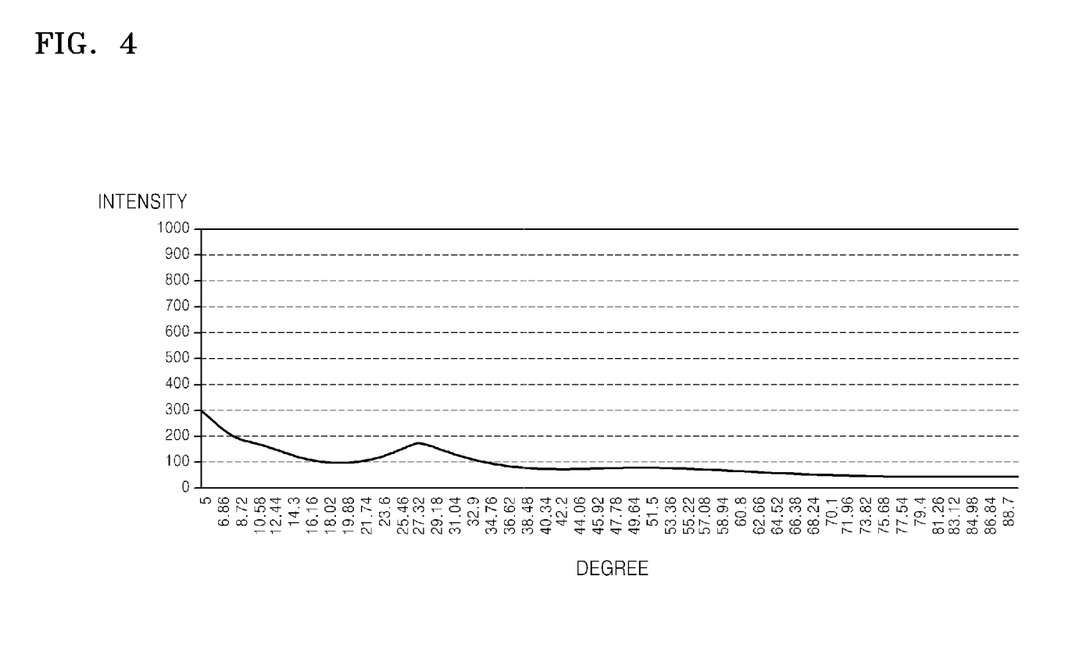
FIGS. 4 and 5 are graphs illustrating XRD results of a mixture used for fabricating a sputtering target in accordance with different embodiments of the inventive concept.

FIG. 4 is a graph illustrating an XRD result of a mixture in accordance with an exemplary embodiment. The mixture may be used to fabricate a sputtering target. Referring to FIG. 4, the mixture (that is being analyzed) includes a first powder material and a second powder material. The first powder material includes a Sn—P—O-based material, for example, about 80 mol % of SnO and about 20 mol % of $P_2O_5$. The second powder material includes carbon nanotubes. Since the XRD result in FIG. 4 does not indicate any sharp peak intensities, the mixture is therefore in an amorphous state.

Figure 5:
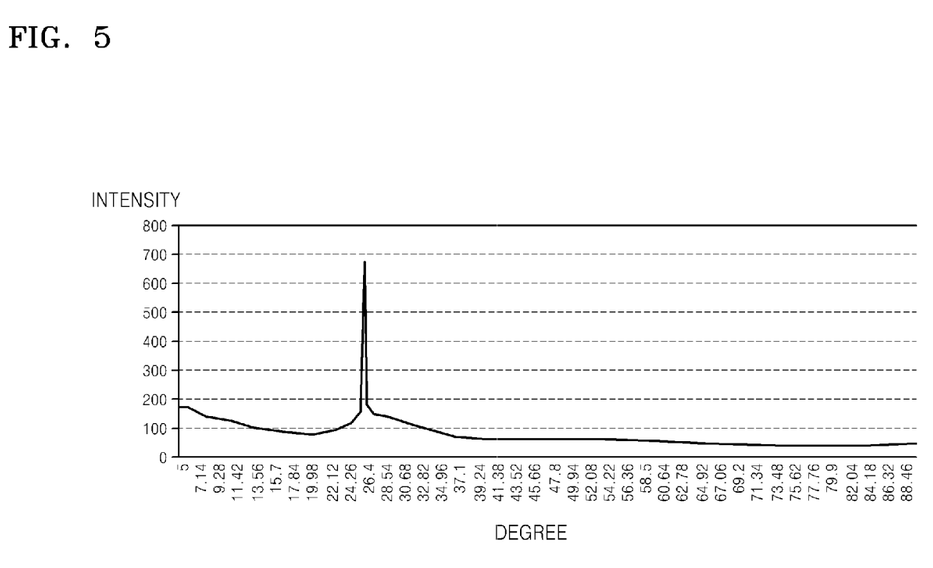

FIG. 5 is a graph illustrating an XRD result of a mixture in accordance with another exemplary embodiment. The mixture may be used to fabricate a sputtering target. Referring to FIG. 5, the mixture includes a first powder material and a second powder material. The first powder material includes a Sn—P—O-based material, for example, about 80 mol % of SnO and about 20 mol % of $P_2O_5$. The second powder material includes conductive carbon black powder. The conductive carbon black powder may include crystalline carbon. In contrast to FIG. 4, the XRD result in FIG. 5 indicates a sharp peak intensity occurring at around 26 degrees (corresponding to crystalline carbon).

Referring back to FIG. 1, the mixture is then compressed and sintered to form a preliminary target (Step S15). The compression step includes pressurizing the mixture. The sintering step includes a cementation process in which the mixture is heated and molded into a certain shape. In some embodiments, the compression and sintering of the mixture may be performed at the same time to form the preliminary target.

When the preliminary target is formed by sequentially compressing and sintering the mixture, the preliminary target may be poorly shaped and may break easily. However, when the preliminary target is formed by compressing and sintering the mixture at the same time, the shape of the preliminary target may be maintained, thereby improving the structural integrity of the preliminary target. Furthermore, by compressing and sintering the mixture at the same time, the processing time for the preliminary target may be reduced (compared to sequentially compressing and sintering the mixture).

Finally, the preliminary target is polished and post-treated to form a sputtering target (Step S16). In particular, the surface of the preliminary target is polished to remove foreign materials. The fabrication of the sputtering target is complete when the preliminary target is attached to a packing plate of a sputtering apparatus.

Figure 2:
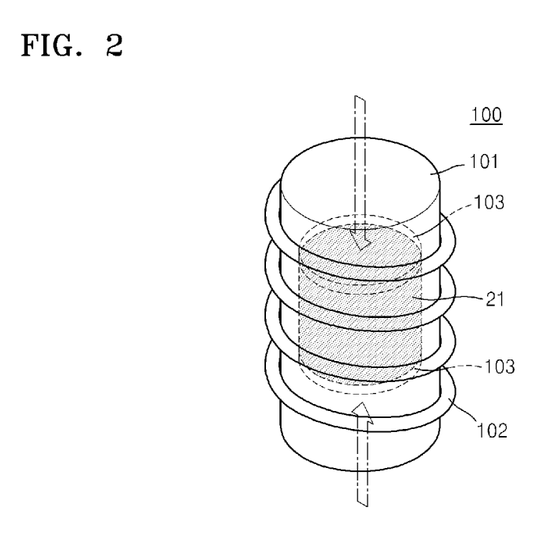
FIG. 2 is a schematic diagram of a target fabricating apparatus in accordance with an exemplary embodiment.

FIG. 2 is a schematic diagram of a target fabricating apparatus in accordance with an exemplary embodiment. The target fabricating apparatus is used to fabricate a preliminary target.

Referring to FIG. 2, a target fabricating apparatus 100 includes a container 101 (e.g., a crucible) for holding a mixture 21, a heating unit (e.g., coil 102) for heating the mixture 21, and one or more plates 103 for pressurizing the mixture 21. A method of forming the preliminary target using the target fabricating apparatus 100 will be described in further detail below.

In some embodiments, the preliminary target is formed in a reducing atmosphere to eliminate oxygen from the mixture. The reducing atmosphere may be achieved by using the container 101 (containing carbon) to fabricate the preliminary target. The mixture 21 is placed in contact with the carbon on an inner surface portion of the container 101. When the mixture 21 in the container 101 is heated to sinter, the carbon in the container 101 may combine with oxygen from the mixture 21 (thus creating a reducing atmosphere).

Accordingly, the oxygen in the oxide in the mixture 21 is eliminated by the reducing atmosphere, which results in metal cations (for example, $Sn^{2+}$) being present in the (reduced) mixture 21. The metal cations (e.g. $Sn^{2+}$) are present in the mixture 21 as network modifiers. The metal cations (e.g. $Sn^{2+}$) react with oxygen in the atmosphere to form a layer including metal cations such as $Sn^{4+}$. In some embodiments, the metal cations such as $Sn^{4+}$ may act as network modifiers along with phosphor and boron ions. When the compression and sintering of the mixture 21 are performed at the same time, a strongly cemented preliminary target may be formed (without having to add a binder material to the mixture 21).

Although a binder material may be used to fabricate a strongly cemented preliminary target, the binder material may include impurities that impact the transmittance and purity of the sputtered thin film. However, if the preliminary target is fabricated without using a binder material, the target may not be strongly cemented, may be poorly shaped, and may break easily.

Accordingly, by fabricating the preliminary target in a reducing atmosphere (and by compressing and sintering the mixture 21 at the same time), a strongly cemented target having a $Sn^{2+}$-rich state may be obtained without the need to use a binder material. Since a binder material is not used, a thin film having a low impurity level may be sputtered using the exemplary preliminary target.

In some embodiments, the mixture may be sintered at a temperature of about 200 degrees to about 450 degrees Celsius. In some embodiments, the sintering may be performed using high frequency induction heating. The high frequency induction heating includes placing a conductive material in the coil and applying a high frequency to the coil. The high frequency generates eddy currents near the conductive material, and the mixture is then heated by the eddy currents.

Referring to FIG. 2, the coil 102 corresponds to a heating unit and is disposed on the outer surface of the container 101. A high frequency is applied to the coil 102 to heat the container 101 and the mixture 21 in the container 101. When the heating is performed using high frequency induction heating, the heat may be uniformly transferred. As such, the uniformity of the surface and the inner portions of the preliminary target may be improved using high frequency induction heating (compared to other heating methods, e.g. using a heat oven).

In some embodiments, the mixture 21 may be compressed at a pressure ranging from about 250 kgf/cm$^2$ to about 350 kgf/cm$^2$. The compression may be carried out using the plates 103 as described below.

As shown in FIG. 2, a plate 103 is disposed at an upper surface of the container 101, and another plate 103 is disposed at a lower surface of the container 101. The mixture 21 is disposed between the two plates 103. The mixture 21 may be gradually compressed by decreasing the distance between the two plates 103. In the embodiment of FIG. 2, the mixture 21 may be compressed from both sides (i.e. the two plates 103 move towards each other). However, the inventive concept is not limited to the above-described configuration. For example, in some other embodiments, the mixture 21 may be compressed by applying pressure from only one side (i.e. one of the plates 103 is moving while the other plate 103 is stationary). The plate 103 may be formed of a material having high thermal conductivity and corrosion-resistance (such as stainless steel (SUS)).

As previously described with reference to FIG. 1, the preliminary target may be formed by compressing and sintering the mixture 21 at the same time, which maintains the shape of the preliminary target and improves the structural integrity of the preliminary target. Furthermore, by compressing and sintering the mixture 21 at the same time, the processing time for the preliminary target may be reduced (compared to sequentially compressing and sintering the mixture).

Figure 6:
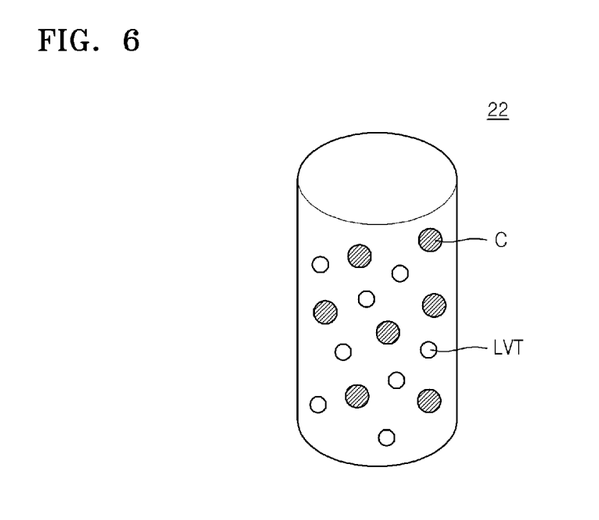
FIG. 6 is a schematic diagram of a sputtering target fabricated using the method described in FIG. 1.

FIG. 6 is a schematic diagram of an exemplary sputtering target fabricated using the method described in FIG. 1. As illustrated in FIG. 6, a sputtering target 22 includes a first powder material LVT and a second powder material. The first powder material LVT may include a Sn—P—O-based material (for example, about 80 mol % of SnO and about 20 mol % of P$_2$O$_5$). The second powder material LVT may include a carbon component C. The carbon component C may include carbon nanotubes or conductive carbon black powder.

Figure 7:
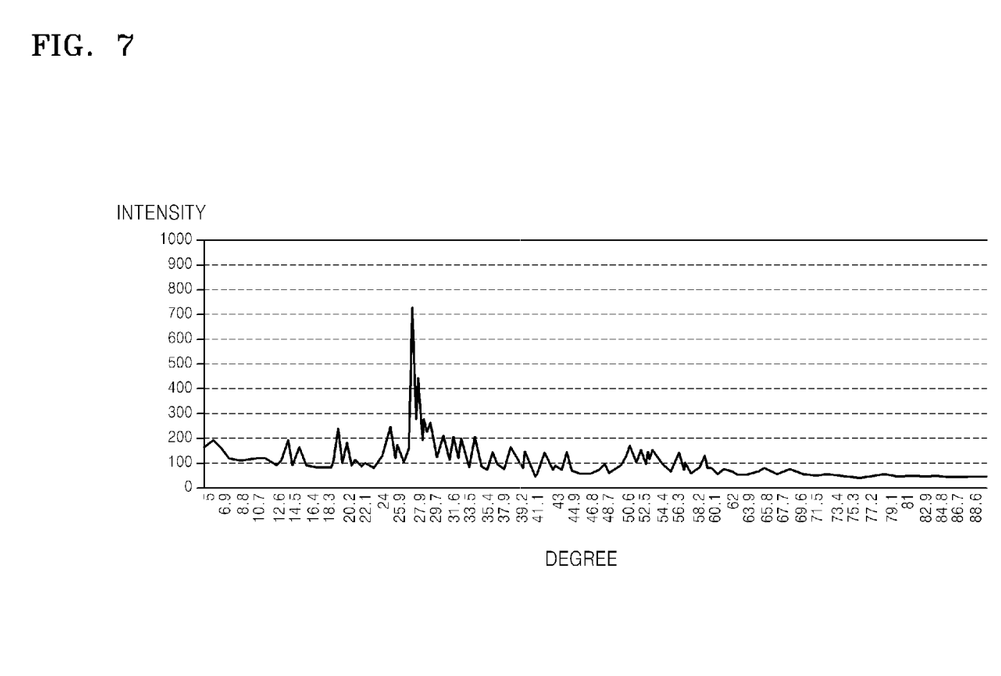
FIGS. 7 and 8 are graphs illustrating XRD results of a sputtering target in accordance with different embodiments of the inventive concept.

FIG. 7 is a graph illustrating an XRD result of the sputtering target 22 in FIG. 6 in accordance with an exemplary embodiment. Referring to FIG. 7, the sputtering target 22 includes a first powder material and a second powder material. The first powder material includes a Sn—P—O-based material (for example, about 80 mol % of SnO and about 20 mol % of P$_2$O$_5$). The second powder material includes a carbon component. The carbon component includes carbon nanotubes. Similar to FIG. 5, the XRD result in FIG. 7 indicates a sharp peak intensity occurring at around 26 degrees (corresponding to crystalline carbon). Based the XRD result in FIG. 7, it may be deduced that the carbon nanotubes have some form of crystallinity (as a result of the compression and sintering process).

It should be noted that the resistance of the sputtering target 22 in FIGS. 6 and 7 is lower than the resistance of the first powder material. The resistance of the sputtering target 22 decreases when the concentration of carbon nanotubes in the target 22 is increased, as described below.

The resistance of a sputtering target without carbon nanotubes was measured to range from thousands to tens of thousands of ohms. When the sputtering target 22 includes 0.5 wt % carbon nanotubes, a resistance of about 50 ohms was measured. When the sputtering target 22 includes 1 wt % carbon nanotubes, a resistance of about 10 ohms was measured. When the sputtering target 22 includes 1.5 wt % carbon nanotubes, a resistance of about 1.5 ohms was measured. When the sputtering target 22 includes 3 wt % carbon nanotubes, a resistance of about 1.0 ohm was measured. When the sputtering target 22 includes 5 wt % carbon nanotubes, a resistance of about 0.2 ohm was measured.

Figure 8:
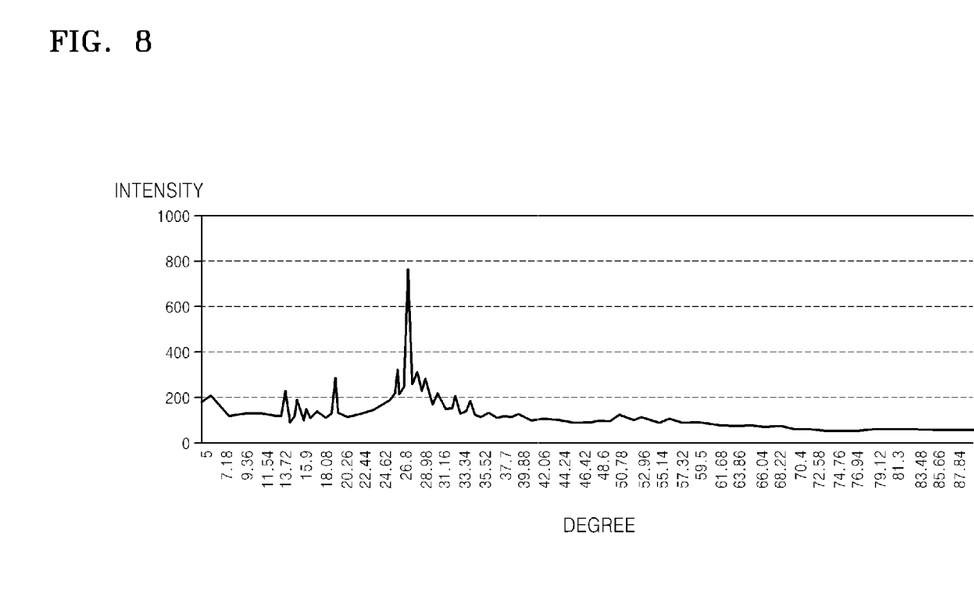

FIG. 8 is a graph illustrating an XRD result of the sputtering target 22 in FIG. 6 in accordance with another exemplary embodiment. Referring to FIG. 8, the sputtering target includes a first powder material and a second powder material. The first powder material includes a Sn—P—O-based material (for example, about 80 mol % of SnO and about 20 mol % of P$_2$O$_5$). The second powder material includes a carbon component. The carbon component includes conductive carbon black powder. Similar to FIGS. 5 and 7, the XRD result in FIG. 8 indicates a sharp peak intensity occurring at around 26 degrees (corresponding to crystalline carbon). Based the XRD result in FIG. 8, it may be deduced that the conductive carbon black powder have some form of crystallinity (as a result of the compression and sintering process).

The resistance of the sputtering target of FIG. 8 is also lower than the resistance of the first powder material. The resistance of the sputtering target 22 decreases when the concentration of carbon black powder in the sputtering target 22 is increased, as described below.

The resistance of a sputtering target without conductive carbon black powder was measured to range from thousands to tens of thousands of ohms. When the sputtering target 22 includes 5 wt % conductive carbon black powder, a resistance of about 802 ohms was measured. When the sputtering target includes 6 wt % conductive carbon black powder, a resistance of about 450 ohms was measured. When the sputtering target includes 9 wt % conductive carbon black powder, a resistance of about 11 ohms was measured. When the sputtering target includes 11 wt % conductive carbon black powder, a resistance of about 5.97 ohms was measured. When the sputtering target includes 20 wt % conductive carbon black powder, a resistance of about 0.2 ohm was measured.

As described above, when a carbon component is added to a sputtering target including an LVT inorganic material, the sputtering target may have low resistance and improved conductivity. Thus, the sputtering target can maintain a low negative potential relative to the substrate, and a thin film comprising the LVT inorganic material may be reliably formed using the sputtering target.

Figure 9:
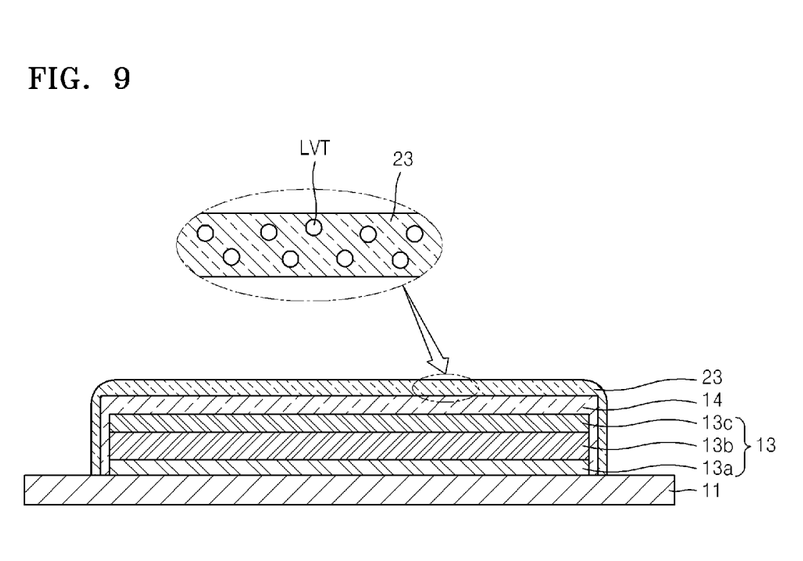
FIG. 9 is a schematic diagram of a thin film encapsulation layer of an organic light-emitting display apparatus according to an exemplary embodiment.

FIG. 9 is a schematic diagram of a thin film encapsulation layer of an organic light-emitting display apparatus according to an exemplary embodiment. The thin film encapsulation layer can be manufactured using the sputtering target 22 described in FIG. 7 or 8.

Referring to FIG. 9, an organic light-emitting display apparatus includes an organic light-emitting unit 13 formed on a substrate 11. The organic light-emitting unit 13 includes a stacked structure comprising a lower electrode 13a, an intermediate layer 13b, and an upper electrode 13c. The intermediate layer 13b includes an organic light-emitting layer. The organic light-emitting unit 13 may further include a passivation layer 14 formed using an organic material. The organic light-emitting unit 13 emits light from the organic light-emitting layer.

However, the organic material in the organic light-emitting layer may deteriorate in the presence of humidity and oxygen. Thus, the organic light-emitting unit 13 is encapsulated to protect the organic light-emitting layer from humidity and oxygen, so as to improve the reliability of the organic light-emitting display apparatus.

As shown in FIG. 9, the organic light-emitting unit 13 may be encapsulated by a thin film encapsulation layer 23. The thin film encapsulation layer 23 may include an LVT inorganic material. As mentioned above, the thin film encapsulation layer 23 may be formed using a sputtering process and the exemplary sputtering target described in FIG. 7 or 8.

When the thin film encapsulation layer 23 is formed using an exemplary sputtering target, the thin film encapsulation layer 23 includes the first powder material LVT. For example, the thin film encapsulation layer 23 may include tin oxide if the sputtering target 22 includes tin oxide. If the sputtering target 22 includes at least one of phosphor oxide, boron phosphate, tin fluoride, niobium oxide, silicon oxide, tungsten oxide, zinc oxide, and boron oxide (in addition to the tin oxide), the thin film encapsulation layer 23 may further include one or more of the above components.

However, a carbon component may be absent from the thin film encapsulation layer 23. For example, even though the sputtering target 22 may include a carbon component (for example, carbon nanotubes or conductive carbon black powder), the carbon component may not be incorporated into the thin film encapsulation layer 23, for the reasons discussed below.

Figure 10:
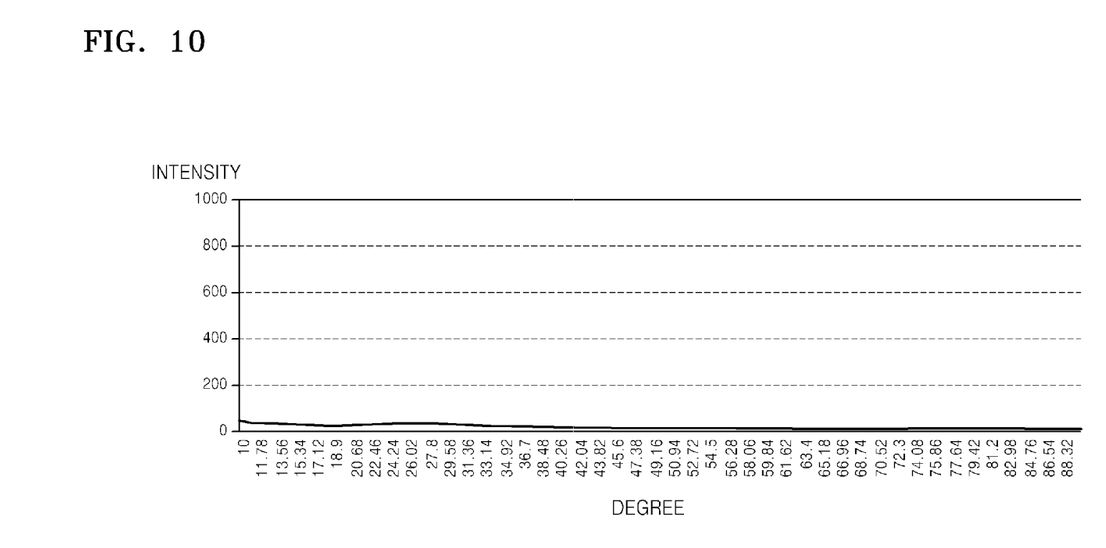
FIGS. 10 and 11 are graphs illustrating XRD results of a thin film encapsulation layer in accordance with different embodiments of the inventive concept.

FIG. 10 is a graph illustrating an XRD result of the thin film encapsulation layer 23 of FIG. 9 in accordance with an embodiment. The thin film encapsulation layer 23 in FIG. 10 is formed using a sputtering target 22. The sputtering target includes a first powder material and a second powder material. The first powder material includes a Sn—P—O-based material (for example, about 80 mol % of SnO and about 20 mol % of $P_2O_5$). The second powder material includes a carbon component. The carbon component includes conductive carbon black powder.

Figure 11:
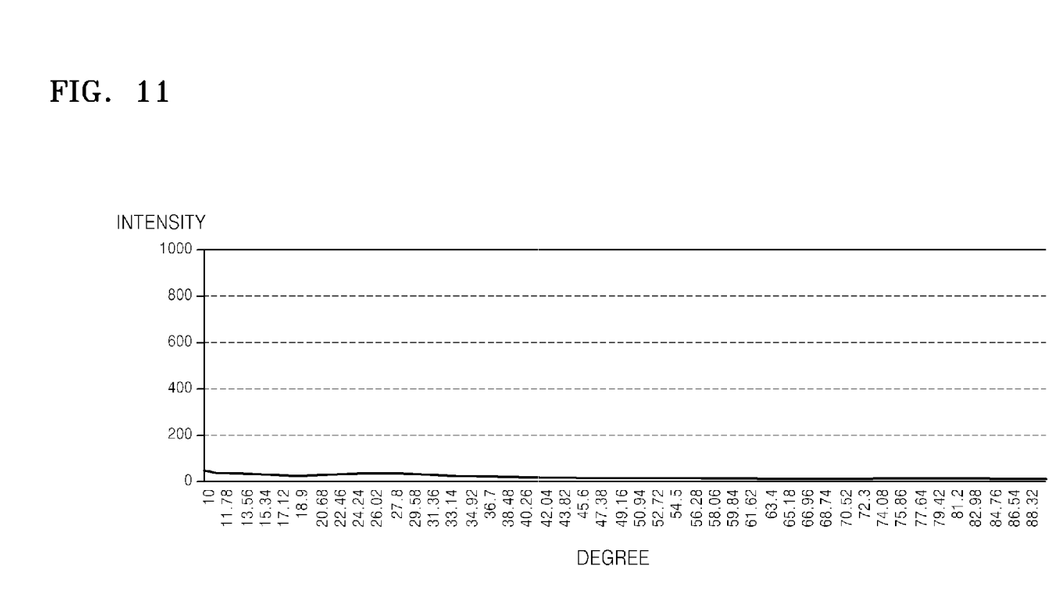

FIG. 11 is a graph illustrating an XRD result of the thin film encapsulation layer 23 of FIG. 9 in accordance with another embodiment. FIG. 11 is similar to FIG. 10, except the carbon component in FIG. 11 includes carbon nanotubes instead of conductive carbon black powder.

Unlike FIGS. 7 and 8, a sharp peak intensity is not present in the XRD results of FIGS. 10 and 11. Specifically, a sharp peak intensity occurring around 26 degrees (corresponding to crystalline carbon) is not detected in in the XRD results of FIGS. 10 and 11. In other words, the thin film encapsulation layer 23 does not include the carbon component from the sputtering target 22. The carbon component is not incorporated into the thin film encapsulation layer 23 because the carbon component combines with oxygen and is removed during the sputtering process. Since the thin film encapsulation layer 23 does not include foreign materials (such as the carbon component), defects such as decreasing transmittance and color change can be reduced.

Although the exemplary sputtering target may include other conductive materials (for example, a metal) in addition to carbon, the metal may act as a foreign material, and may change the color of the thin film and cause the transmittance of the thin film to deteriorate. As a result, in some embodiments, only carbon is added to the sputtering target. Therefore, a sputtering target having low resistance and improved conductivity may be fabricated using the above-described embodiments. Also, a thin film consisting of LVT inorganic material may be formed using the sputtering target.

It should be understood that the above-described embodiments are merely exemplary and should not be construed as limiting the inventive concept. The features or aspects in each embodiment are applicable to other embodiments.

While one or more embodiments of the inventive concept have been described, it will be understood by those of ordinary skill in the art that the embodiments may be modified in various ways without departing from the spirit and scope of the present disclosure.

What is claimed is:

1. A method of manufacturing an organic light-emitting display apparatus, the method comprising:
   forming an organic light-emitting unit on a substrate, wherein the organic light-emitting unit includes a lower electrode, an organic light-emitting layer, and an upper electrode; and
   forming a thin film encapsulation layer on the organic light-emitting unit by a sputtering process using a sputtering target,
   wherein the sputtering target comprises a first powder material including tin oxide and a second powder material including carbon, wherein the first powder material and the second powder material are homogeneously mixed in the sputtering target, and wherein the sputtering target is formed from a preliminary sputtering target that is rich of tin cations,
   wherein the carbon included in the second powder material is oxidized and depleted during the sputtering process, and
   wherein the thin film encapsulation layer includes the first powder material, and the carbon included in the second powder material is omitted from the thin film encapsulation layer.

2. The method of claim 1, wherein the sputtering target further comprises at least one of phosphor oxide, boron phosphate, tin fluoride, niobium oxide, silicon oxide, lead fluoride, tungsten oxide, zinc oxide, and boron oxide,
   and the thin film encapsulation layer further comprises at least one of the phosphor oxide, boron phosphate, tin fluoride, niobium oxide, silicon oxide, lead fluoride, tungsten oxide, zinc oxide, and boron oxide that is included in the sputtering target.

3. The method of claim 1, wherein the second powder material includes at least one of carbon black powder and carbon nanotubes.

4. The method of claim 1, wherein the second powder material includes carbon black powder, and wherein the sputtering target includes about 1 wt % to about 20 wt % of the carbon black powder and about 80 wt % to about 99 wt % of the first powder material.

5. The method of claim 1, wherein the second powder material includes carbon nanotubes, and wherein the sputtering target includes about 0.1 wt % to about 10 wt % of the carbon nanotubes and about 90 wt % to about 99.9 wt % of the first powder material.

6. The method of claim 1, further comprising:
   mixing and melting a first raw material and a second raw material;
   solidifying the first raw material and the second raw material by rapid cooling;
   pulverizing the first raw material and the second raw material to form the first power material;
   mixing the first power material and the second power material to form a mixture;
   compressing and sintering the mixture to form the preliminary sputtering target; and polishing and post-treating the preliminary sputtering target to form the sputtering target.

7. The method of claim 6, further comprising fabricating the preliminary sputtering target using a target fabrication apparatus, wherein the target fabrication apparatus comprises a container for holding the mixture, a heating unit for heating the mixture; and one or more plates for pressuring the mixture.

8. The method of claim 7, further comprising: forming the preliminary target in a reducing atmosphere to eliminate oxygen from the mixture.

9. The method of claim 8, further comprising:
including second carbon in the container;
exposing the mixture with the second carbon on an inner surface portion of the container; and
heating the mixture to sinter, causing the second carbon in the container to combine with oxygen from the mixture.

10. The method of claim 9, further comprising eliminating the oxygen from the mixture by the reducing atmosphere and forming the tin cations in the mixture.

11. The method of claim 10, further comprising forming a layer of the tin cations.

12. The method of claim 11, further comprising simultaneously compressing and sintering the mixture to form the preliminary target that is rich of the tin cations and free of a binder material.

* * * * *